(12) United States Patent
Mizuno et al.

(10) Patent No.: US 6,340,434 B1
(45) Date of Patent: *Jan. 22, 2002

(54) METHOD AND APPARATUS FOR CHEMICAL-MECHANICAL POLISHING (75) Inventors: Hiroshi Mizuno, Tsukuba; Osamu Kinoshita; Tetsuaki Murohashi, both of Ushiku; Akihisa Ueno; Yoshifumi Sakuma, both of Tsukuba, all of (JP); Kostas Amberiadis, San Jose, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/148,028

(22) Filed: Sep. 3, 1998

(30) Foreign Application Priority Data

Sep. 5, 1997 (JP) ............................................... 9-240829

(51) Int. Cl.$^7$ ..................... H01L 21/302; H01L 21/461; B24B 1/00
(52) U.S. Cl. .............................. 216/38; 216/52; 216/88; 216/89; 216/90; 216/91; 438/692; 438/693; 451/63
(58) Field of Search ....................... 156/345; 216/88–90, 216/38, 52, 91; 438/690–692, 693; 451/285–287

(56) References Cited

U.S. PATENT DOCUMENTS

| | | |
|---|---|---|
| 3,744,188 A | 7/1973 | Sharpless |
| 4,347,689 A | 9/1982 | Hammond |
| 4,671,018 A | 6/1987 | Ekhoff |
| 4,680,893 A | 7/1987 | Cronkhite et al. ............ 51/5 R |
| 4,793,895 A | 12/1988 | Kaanta et al. |

(List continued on next page.)

Primary Examiner—Jeffrie R. Lund (57) ABSTRACT

A method for chemical-mechanical polishing of a layer that is deposited on a surface of an integrated circuit substrate is described. The method includes: (1) immobilizing the integrated circuit substrate using a substrate holder such that the integrated circuit substrate surface is positioned against a surface of a polishing pad, which is mounted on a supporting surface; (2) a first stage of polishing the substrate surface including maintaining a predetermined difference between the rotational velocity of the polishing pad and the rotational velocity of the substrate holder allowing an endpoint of the chemical-mechanical polishing process of the layer to be detected; and (3) a second stage of polishing the substrate such that the rotational velocity of the polishing pad and the rotational velocity of the substrate holder are substantially the same to produce a substantially planar substrate surface.

17 Claims, 10 Drawing Sheets

U.S. PATENT DOCUMENTS

| | | | |
|---|---|---|---|
| 4,918,870 A | 4/1990 | Torbert et al. ............. 51/131.3 | |
| 5,036,015 A | 7/1991 | Sandhu et al. | |
| 5,081,421 A | 1/1992 | Miller et al. | |
| 5,151,584 A | 9/1992 | Ebbing et al. | |
| 5,169,491 A | 12/1992 | Doan | |
| 5,196,353 A | 3/1993 | Sandhu et al. | |
| 5,222,329 A | 6/1993 | Yu | |
| 5,240,552 A | 8/1993 | Yu et al. | |
| 5,245,790 A | 9/1993 | Jerbic | |
| 5,245,794 A | 9/1993 | Salugsugan | |
| 5,265,378 A | 11/1993 | Rostoker | |
| 5,272,115 A | 12/1993 | Sato | |
| 5,308,438 A | 5/1994 | Cote et al. | |
| 5,310,455 A | 5/1994 | Pasch et al. | |
| 5,321,304 A | 6/1994 | Rostoker | |
| 5,337,015 A | 8/1994 | Lustig et al. | |
| 5,389,194 A | 2/1995 | Rostoker et al. | |
| 5,399,234 A | 3/1995 | Yu et al. | |
| 5,403,228 A | 4/1995 | Pasch | |
| 5,405,806 A | 4/1995 | Pfeister et al. | |
| 5,439,551 A | 8/1995 | Meikle et al. | |
| 5,483,568 A | 1/1996 | Yano et al. | |
| 5,492,594 A | 2/1996 | Burke et al. | |
| 5,516,400 A | 5/1996 | Pasch et al. | |
| 5,531,861 A | 7/1996 | Yu et al. | |
| 5,559,428 A | 9/1996 | Li et al. | |
| 5,561,541 A | 10/1996 | Sharp et al. | |
| 5,595,526 A | 1/1997 | Yau et al. | |
| 5,597,442 A | 1/1997 | Chen et al. | |
| 5,609,511 A | 3/1997 | Moriyama et al. | |
| 5,624,304 A | 4/1997 | Pasch et al. | |
| 5,626,715 A | 5/1997 | Rostoker | |
| 5,637,185 A | 6/1997 | Murarka et al. | |
| 5,639,388 A | 6/1997 | Kimura et al. | |
| 5,643,044 A | 7/1997 | Lund | |
| 5,643,046 A | 7/1997 | Katakabe et al. | |
| 5,643,050 A | 7/1997 | Chen | |
| 5,644,221 A | 7/1997 | Li et al. | |
| 5,647,952 A | 7/1997 | Chen | |
| 5,658,183 A | 8/1997 | Sandhu et al. | |
| 5,660,672 A | 8/1997 | Li et al. | |
| 5,663,797 A | 9/1997 | Sandhu | |
| 5,664,987 A | 9/1997 | Renteln | |
| 5,667,424 A | 9/1997 | Pan | |
| 5,667,433 A | 9/1997 | Mallon | |
| 5,667,629 A | 9/1997 | Pan et al. | |
| 5,668,063 A | 9/1997 | Fry et al. | |
| 5,670,410 A | 9/1997 | Pan | |
| 5,672,091 A | 9/1997 | Takahashi et al. | |
| 5,674,784 A | 10/1997 | Jang et al. | |
| 5,695,660 A | 12/1997 | Litvak | |
| 5,700,180 A | 12/1997 | Sandhu et al. | |
| 5,705,435 A | 1/1998 | Chen | |
| 5,710,076 A | 1/1998 | Dai et al. | |
| 5,712,185 A | 1/1998 | Tsai et al. | |
| 5,722,875 A | 3/1998 | Iwashita et al. | |
| 5,725,414 A | * 3/1998 | Moinpour et al. ............ 451/41 | |
| 5,733,175 A | 3/1998 | Leach ......................... 451/41 | |
| 5,741,171 A | 4/1998 | Sarfaty et al. | |
| 5,777,739 A | 7/1998 | Sandhu et al. | |
| 5,804,513 A | * 9/1998 | Sakatani et al. ............ 438/693 | |
| 5,853,604 A | * 12/1998 | Kim ........................... 216/88 | |
| 5,861,055 A | 1/1999 | Allman et al. | |
| 5,865,666 A | 2/1999 | Nagahara | |
| 5,868,608 A | 2/1999 | Allman et al. | |
| 5,873,769 A | 2/1999 | Chiou et al. .................... 45/17 | |
| 5,882,251 A | 3/1999 | Berman et al. | |
| 5,888,120 A | 3/1999 | Doran | |
| 5,893,756 A | 4/1999 | Berman et al. | |
| 5,931,719 A | 8/1999 | Nagahara et al. | |
| 5,944,588 A | * 8/1999 | Marmillion et al. ........ 451/242 | |
| 5,948,697 A | 9/1999 | Hata | |
| 5,950,327 A | * 9/1999 | Peterson et al. .............. 34/328 | |
| 5,957,757 A | 9/1999 | Berman | |
| 5,975,986 A | * 11/1999 | Allen et al. .................... 451/5 | |
| 6,022,807 A | * 2/2000 | Lindsey et al. ............. 438/693 | |

\* cited by examiner

SCALE: |—————| 0.20 um.

METHOD AND APPARATUS FOR CHEMICAL-MECHANICAL POLISHING

CLAIM OF PRIORITY

This patent application claims priority to a Japanese Patent Application No. 240829/97 filed on Sep. 5, 1997 and is related to U.S. patent application Ser. No. 09/140,472 filed on Aug. 26, 1998, which application is incorporated herein by reference for all purposes.

BACKGROUND OF THE INVENTION

The present invention relates to methods and apparatuses for chemical-mechanical polishing (CMP) of an integrated circuit (IC) substrate. More particularly, the present invention relates to methods and apparatuses for a two stage chemical mechanical polishing (CMP) of an integrated circuit (IC) substrate surfaces and minimizing alignment shift that may occur during transferring of a circuit pattern from a reticle or a photomask to the IC substrate surface.

An IC, such as a semiconductor device is manufactured by forming circuits consisting of metal wiring on an IC substrate, e.g., a semiconductor substrate. The metal wiring forms an IC by connecting a plurality of discrete elements in the device with one another. Furthermore, the discrete elements in one layer are insulated from discrete elements in other layers of the device by a dielectric layer. In order to electrically connect one layer with another, one or more contact holes are formed through the dielectric layer and electrical connection is provided therethrough. As the degree of integration of VLSI's increases due to advances in technology, more and more wiring layers and discrete elements are increasingly required on the semiconductor substrate.

When metal wiring is formed on a substrate, the substrate surface is generally coarse and not very planar. However, when more than one layer containing discrete elements is employed to form an IC, it is important that the surface of each layer, including dielectric layers and wiring be made planar in order to accurately form contact holes and metal layers, improve the yield of the device and maintain the reliability of the final ICs. Particularly, when a circuit or wiring pattern from a reticle or photomask is transferred to the dielectric layer according to conventional photolithography, unless the dielectric layer is planar, it is difficult to accurately align the alignment tool above the IC substrate surface using alignment marks that may be formed in the conductive layer disposed below the transparent dielectric layer.

CMP is a planarization method currently employed to planarize substrate surface layers including dielectric layers and wiring. CMP typically involves mounting IC substrates face down on a substrate holder, e.g., wafer carrier, and rotating the IC substrate against a polishing pad mounted on a platen. A slurry containing a chemical that chemically interacts with the facing IC substrate layer and an abrasive, e.g., silica, alumina, cerium nitrate, that physically removes that layer is flowed between the IC substrate and the polishing pad or on the pad near the IC substrate. During CMP, both the substrate holder and the polishing pad typically rotate and the chemical condition, pressure, and temperature are controlled as the IC substrate contacts the polishing pad. The contents of the slurry may be chemically adjusted so as to optimize the chemical effects of CMP. Combination of chemical and physical effects of this polishing results in a significant planarization of the polished surface. The mechanical construction and the chemical ingredients of slurry used in CMP are widely known to those skilled in the art.

After being polished by CMP, the surface of an IC substrate is subjected to conventional photolithography to transfer the circuit or wiring pattern from a reticle to an IC substrate surface. In order to facilitate the transfer of the wiring pattern, an alignment tool aligns the placement of the reticle to alignment marks formed on the IC substrate such that the wiring pattern is transferred to the appropriate location on the IC substrate surface.

Unfortunately, when the dielectric layer is not planarized to the requisite amount, it is difficult to align using the alignment marks, which may be out of focus due to the nonplanarity of the dielectric layer. Consequently, there may be an alignment shift and the wiring pattern is not transferred to an appropriate location on the substrate surface.

What is therefore needed is a method and apparatus for CMP that inhibits alignment shift and transfers the wiring pattern to an appropriate location on the substrate surface.

SUMMARY OF THE INVENTION

To achieve the foregoing, the present invention provides a method for chemical-mechanical polishing of a layer that is deposited on a surface of an integrated circuit substrate. The method includes: (1) immobilizing the integrated circuit substrate using a substrate holder such that the integrated circuit substrate surface is positioned against a surface of a polishing pad, which is mounted on a supporting surface; (2) a first stage of polishing the substrate surface including maintaining a predetermined difference between the rotational velocity of the polishing pad and the rotational velocity of the substrate holder allowing an endpoint of the chemical-mechanical polishing process of the layer to be detected; and (3) a second stage of polishing the substrate such that the rotational velocity of the polishing pad and the rotational velocity of the substrate holder are substantially the same to produce a substantially planar substrate surface.

The method described above may further include introducing slurry on the polishing pad. The layer may be a conductive layer, e.g., tungsten, that is disposed above a dielectric layer. The integrated circuit substrate may be a semiconductor wafer and the substrate holder may be a wafer carrier. The supporting surface may be a polishing table or a platen. The rotational velocity of the polishing pad may be controlled by adjusting a rotational velocity of the supporting surface and the rotational velocity of the integrated circuit substrate surface may be controlled by adjusting a rotational velocity of the substrate holder. The second stage of polishing may include rotating both the polishing pad and the integrated circuit substrate surface in the same direction. The second stage of polishing may be carried out until the integrated circuit substrate surface is substantially planar and the substantially planar integrated circuit substrate surface facilitates alignment of an alignment tool above the integrated circuit substrate.

In the first stage of polishing, the endpoint of the chemical-mechanical polishing process of the layer may be detected by monitoring changes in current flow in a motor that is rotating the substrate holder. The first stage of polishing may include rotating both the polishing pad and the integrated circuit substrate surface in the same direction.

In another aspect, the present invention provides another method for chemical-mechanical polishing a layer deposited on a surface of a semiconductor wafer. The method includes: (1) immobilizing the semiconductor wafer using a wafer carrier pushing against a polishing pad that is mounted on a supporting surface; (2) supplying a polishing agent at the interface between the polishing pad and the semiconductor wafer; (3) a first stage of polishing the substrate surface including maintaining a predetermined difference between the rotational velocity of the polishing pad and the rotational velocity of the substrate holder such that an endpoint of the chemical-mechanical polishing process of the layer is detected; and (4) a second stage of polishing the substrate such that the rotational velocity of the polishing pad and the rotational velocity of the substrate holder are substantially the same to produce a substantially planar substrate surface. The polishing agent may be a slurry having predetermined chemical characteristics.

In yet another aspect, the present invention provides a chemical-mechanical polishing apparatus for removing at least portions of a layer deposited on a surface of an integrated circuit substrate. The apparatus includes: (1) means for performing a first stage of polishing the substrate surface, the means for performing the first stage of polishing maintaining a predetermined difference between a rotational velocity of a polishing pad and a rotational velocity of a substrate holder allowing an endpoint of the chemical-mechanical polishing process of the layer to be detected; and (2) means for performing a second stage of polishing the substrate such that the rotational velocity of the polishing pad and the rotational velocity of the substrate holder are substantially the same to produce a substantially planar substrate surface. The polishing pad may be mounted on a supporting surface and the polishing apparatus may further include means for delivering slurry on the polishing pad.

These and other features of the present invention will be described in more detail below in the detailed description of the invention and in conjunction with the following figures.

DETAILED DESCRIPTION OF THE PREFERRED EMBODIMENTS

To achieve the foregoing, the present invention provides methods and apparatuses for a two-stage chemical-mechanical polishing (CMP) of an IC substrate surface to produce a planarized IC substrate surface and thereby inhibit an alignment shift that may occur during transfer of a circuit pattern from a reticle or a photomask to the IC substrate surface. In the following description, numerous specific details are set forth in order to provide a thorough understanding of the present invention. It will be apparent, however, to those skilled in the art, that the present invention may be practiced without some or all of the specific details. In other instances, well known process steps have not been described in detail in order to not unnecessarily obscure the invention. By way of example, the present invention has been described in terms of a reticle, those skilled in the art will, however, recognize that the teachings of the present invention also apply when a circuit pattern is transferred from a photomask to an IC substrate surface.

U.S. patent application Ser. No. 09/140,472 filed on Aug. 26, 1998, discloses that an alignment shift experienced during the process of transferring a reticle pattern to an IC substrate surface can be minimized by keeping the rotational velocities of a polishing pad and a substrate substantially the same or by synchronizing the two rotational velocities during chemical-mechanical polishing (CMP) of the IC substrate. Although a greater degree of planarization is achieved by the methods and apparatuses disclosed in Ser. No. 09/140,472 filed on Aug. 26, 1998 than by the prior art methods and apparatuses of CMP, after extensive experimentation the present invention recognizes that end point detection can be a challenging task when the rotational velocities of a polishing pad and a substrate are substantially the same or the rotational velocities of the polishing pad and the substrate are synchronized. Those skilled in the art will recognize that it is very important to determine the end point of the polishing process to avoid overpolishing and end-point detection may be performed by detecting a change in the load on the spindle motor, which is due to the changes in friction on the surface being polished. The changes in the load will be detected by monitoring the changes in current flowing in the motor.

In accordance with one embodiment of the present invention, the present invention solves the end-point detection problem by dividing the polishing process into two stages. In the first stage of the polishing process, a certain predetermined difference is maintained between the rotational velocities of the polishing pad and the substrate. In one embodiment of the present invention, an appropriate rotational velocity of the polishing pad is obtained by controlling the rotational velocity of the platen or polishing pad table, upon which the polishing pad is mounted and appropriate rotational velocity of the IC substrate is obtained by controlling the rotational velocity of the substrate holder, which holds or immobilizes the IC substrate during polishing. The predetermined difference between the rotational velocities of the polishing pad and substrate facilitates the determination of the end-point of the polishing process by monitoring the current flowing in the motor that drives the rotating the substrate. After the end-point of the polishing process has been detected, the second stage of the polishing process includes polishing the substrate surface such that the rotational velocities of the polishing pad and the substrate surface are substantially the same or synchronized. Thus, in this embodiment, the two-stage polishing method provides a substantially planar substrate surface that facilitates in effectively transferring the circuit or wiring pattern from the reticle to the substrate surface and also accurately determines the end-point of the polishing process.

CMP of an IC substrate surface, in accordance with one embodiment of the present invention, is described below in detail by referring to the appropriate figures. It should be borne in mind, however, that the inventive CMP processes set forth below are described in terms of polishing tungsten (W) and the polishing process called "W-CMP" serves as an example. The present invention is not, however, limited to removal of tungsten, but may be used to polish other materials.

Figure 1:
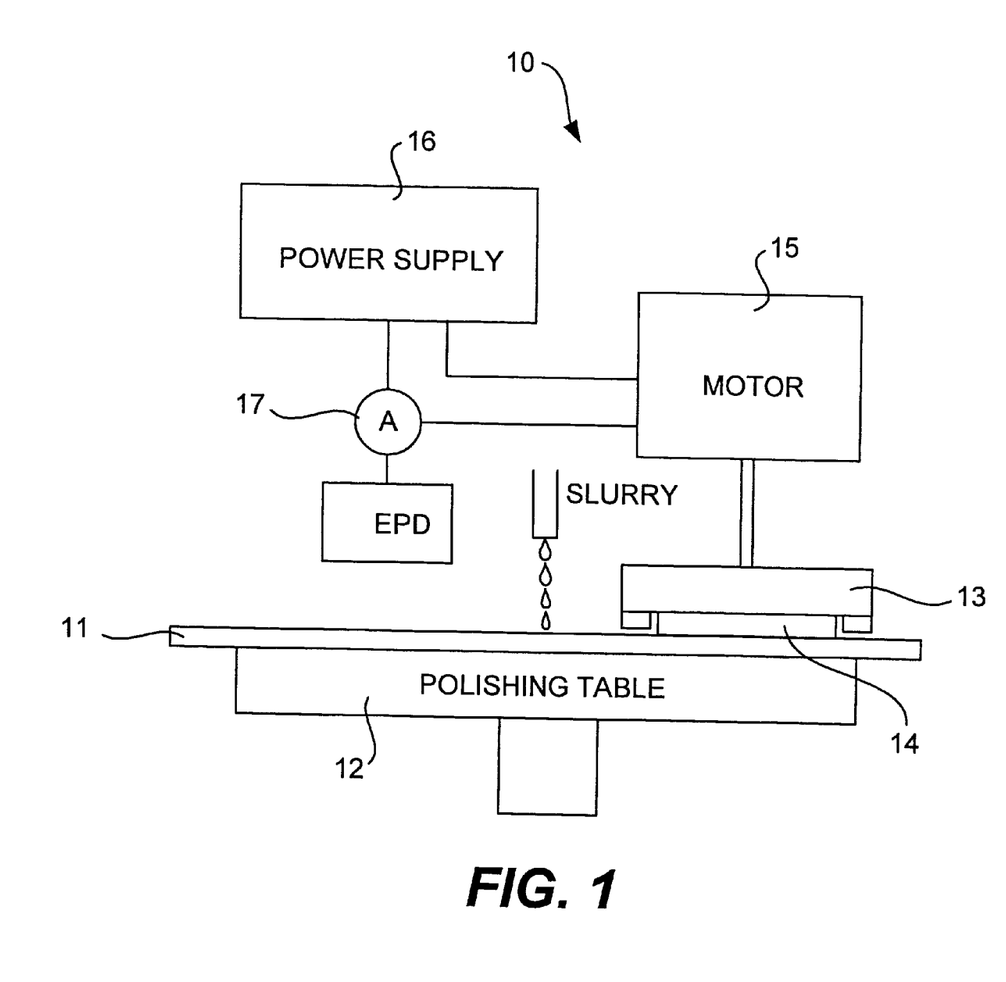
FIG. 1 shows an apparatus for performing chemical-mechanical polishing in accordance with one embodiment of the present invention.

FIG. 1 shows a CMP system 10 that may be employed to carry out the CMP processes in accordance with one embodiment of the present invention. A substrate holder 13 holds an IC substrate 14, which may be secured by means of a vacuum chuck, against a supporting surface (hereinafter referred to as a "polishing table") 12 having a polishing pad 11 mounted thereon. In other embodiments, the supporting surface is a platen. During CMP, both polishing table 12 and substrate holder 13 rotate. A polishing agent, commonly known to those skilled in the art as "slurry," having predetermined chemical characteristics is supplied to the contacting interface between substrate holder 13 and polishing pad 11. A motor 15 for rotating substrate holder 13 and a power supply 16 for motor 15 are provided. A current meter 17 is connected between motor 15 and power supply 16 to monitor the current required to maintain the expected rotational velocity of motor 15. Since the power consumption of motor 15 is proportional to the load on motor 15, changes in the magnitude of friction between IC substrate 14 and polishing pad 11 can be detected by such monitoring so that when the desired polishing has been completed, the end point is detected. An example of the end point detection (EPD) by monitoring current through the motor is disclosed in U.S. Pat. No. 5,308,438 "Endpoint Detection Apparatus and Method for Chemical/Mechanical Polishing" issued to Cote et al. on May 3, 1994, which is incorporated herein by reference for all purposes.

Figure 2:
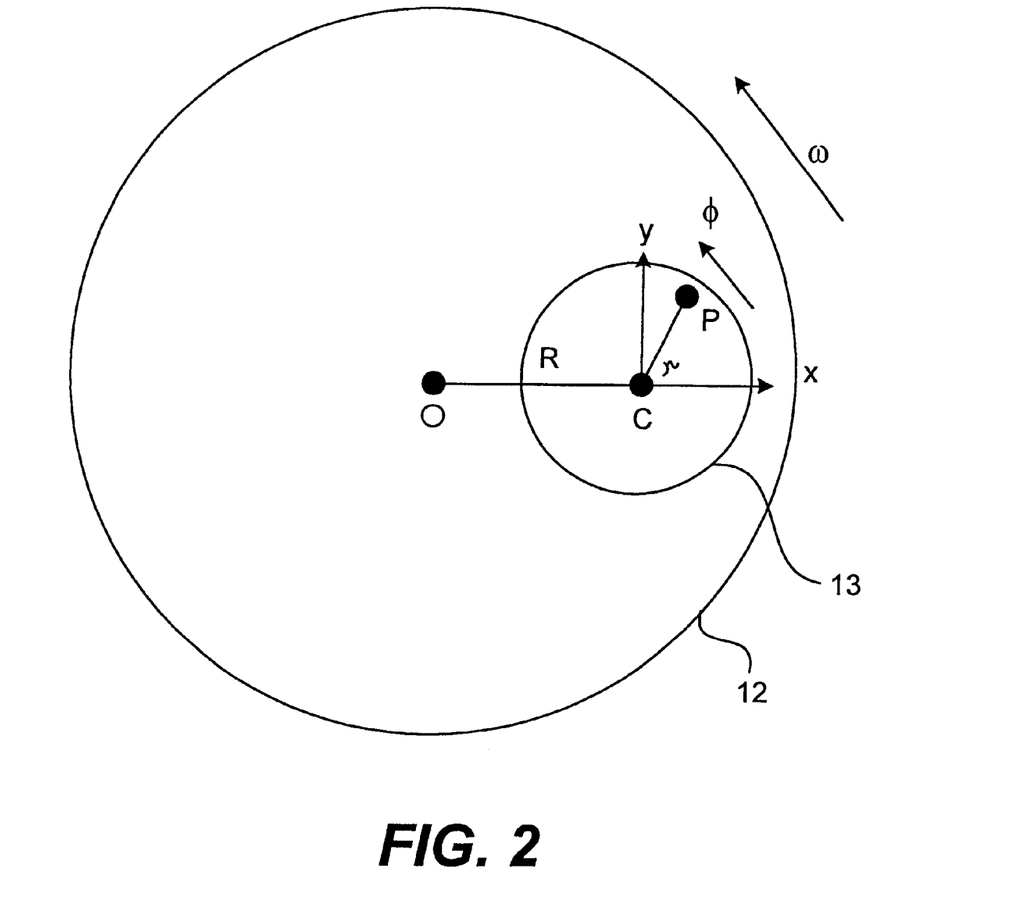
FIG. 2 shows a top view of a substrate holder positioned above a polishing table and the geometrical relationship between the polishing table and substrate holder.

FIG. 2 shows a geometrical relationship between polishing table 12 and substrate holder 13 during CMP, according to one embodiment of the present invention. Substrate holder 13 is positioned off center on polishing table 12. In other words, substrate holder 13 is positioned away from a center (denoted in FIG. 2 by "O") of polishing table 12. In order to describe the geometrical location of an arbitrary point P on substrate holder 13, a frame of reference consisting of x and y coordinates and center C of substrate holder 13 are considered. "R" represents the distance between O and C and "r" represents the distance between C and P, as shown in FIG. 2. Polishing table 12 rotates counterclockwise at an angular velocity of $\omega$ and substrate holder 13 rotates in the same direction at an angular velocity of $\phi$.

Figure 3:
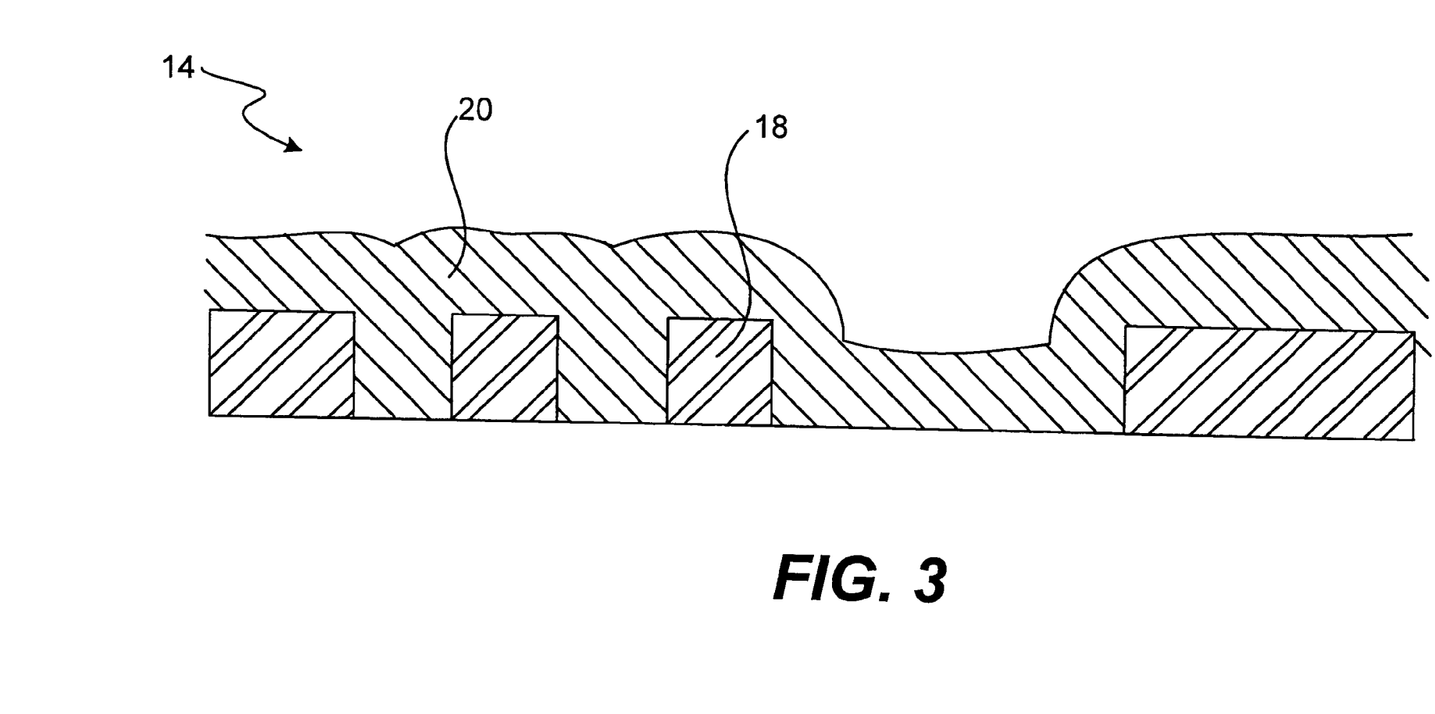
FIG. 3 shows a cross-sectional view of a surface of a semiconductor wafer that is subjected to chemical-mechanical polishing in accordance with one embodiment of the present invention.

FIG. 3 is a cross-sectional view of a surface of IC substrate 14 that is subjected to CMP. A first layer 18 is deposited on the surface of IC substrate 14, where alignment marks are formed to facilitate the alignment of an alignment tool or a stepper (not shown to simplify illustration) above the IC substrate. First layer 18 may be a dielectric layer and has etched therethrough contact holes that are filled with a second layer 20, as shown in the FIG. 3. Second layer 20 may be a conductive layer that includes a metal such as tungsten. In the chemical-mechanical polishing process in accordance with the present invention, the second layer will be polished and the overburden is removed until a preset endpoint is detected in monitoring the change in friction by current meter 17 of FIG. 1, that is, until the polishing reaches the top level of first layer 18.

Figure 4:
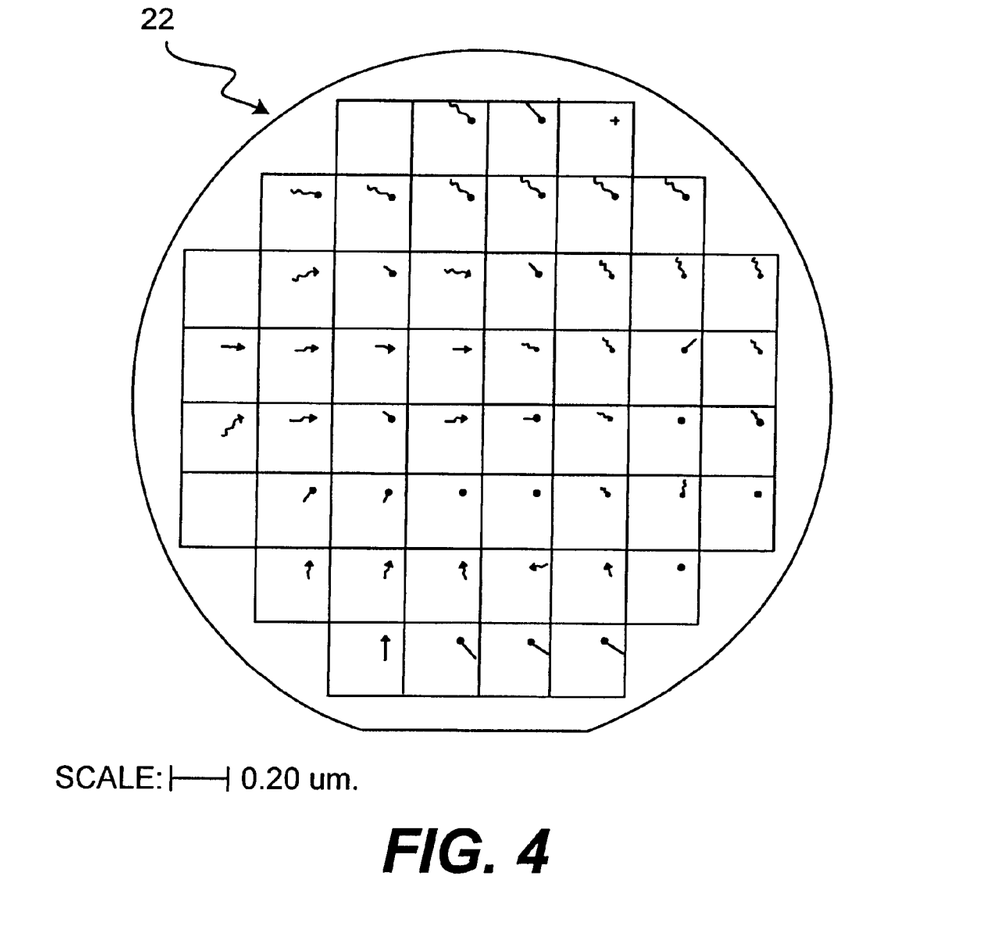
FIG. 4 shows a top view of a semiconductor wafer surface suffering from alignment shifts observed after the wafer is subjected to chemical-mechanical polishing according to conventional methods.

In accordance with one embodiment, IC substrate 14 is a semiconductor wafer. FIG. 4 shows geometrical vectors representative of the direction and magnitude of alignment shifts caused by the polishing process at many locations on a semiconductor wafer 22. When a W-CMP process is compared to an etch-back process of tungsten, more significant pattern shifts are observed when transferring circuit patterns from a reticle.

Figure 5:
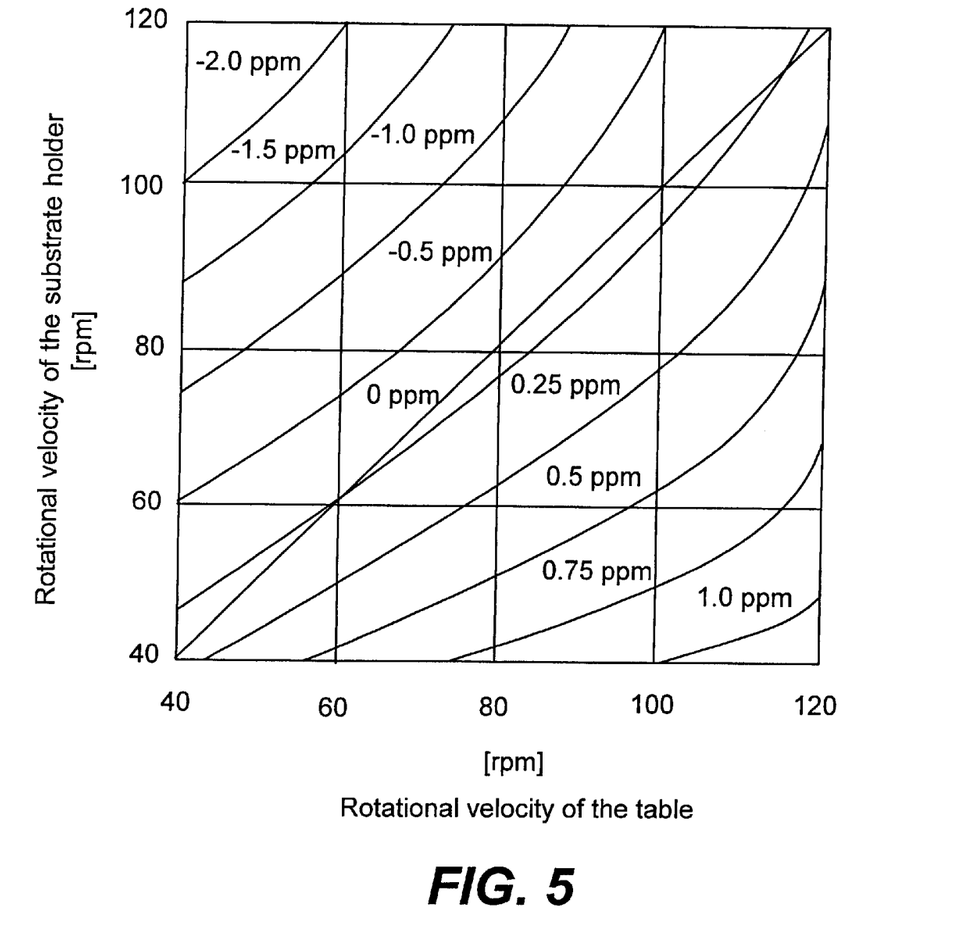
FIG. 5 shows a graph of rotational velocity of the substrate holder versus the rotational velocity of the polishing table.

The present invention recognizes that rotational velocities of the substrate and the polishing pad are important physical parameters in the polishing process including the pressure with which IC substrate 14 is pressed onto polishing pad 11 and the temperature of the contacting interface. While intending not to be bound by theory, according to the present invention the interrelationship between rotational velocity $\phi$ of substrate holder 13 and rotational velocity $\omega$ of polishing table 12 causes some mechanical influence on the surface being polished and that the generation of the alignment shifts on the IC substrate after the CMP process depends upon this interrelationship. This interrelationship is studied by setting up a variety of combinations of these two rotational velocities and measuring the pattern shift associated with each combination of the velocities. The result of this experiment, shown as a graph in FIG. 5, indicates that the pattern shift will be minimum when the rotational velocity of polishing table 12 (x-axis) and the rotational velocity of substrate holder 13 (y-axis) are substantially the same, that is, $\phi$ is approximately equal to $\omega$.

The present invention thus empirically establishes that the matching of the two velocities or $\phi \approx \omega$ gives the optimum control condition to minimize the alignment shifts encountered by the prior art techniques. While not intending not to be bound by theory, the present invention hereinafter details the interrelationship of the velocities and the alignment shifts using notations introduced in connection with description of FIG. 2.

By considering a frame of reference consisting of x-y coordinates having center C of substrate holder 13 as its origin, the x and y components Vx, Vy of the relative velocity V of point P on wafer carrier 13 can be written as follows:

$$Vx = -\omega R \sin(\phi t) \qquad \text{equation 1}$$

$$Vy = r(\phi - \omega) - \omega R \cos(\phi t) \qquad \text{equation 2,}$$

where t represents time.

As is clear from equation 1, Vx is independent of the distance from center C to point P and of the location of point P on substrate holder 13 because Vx does not contain parameter r. Though Vy contains parameter r, when $(\phi - \omega) = 0$, that is, $\phi = \omega$, the term containing r is canceled and Vy is, like Vx, independent of the distance from center C to point P and thus of the location of point P on substrate holder 13. In this case, equation 2 will be written as follows:

$$Vy = \omega R \cos(\phi t) \quad \text{equation 3}$$

Therefore, x and y components of the relative velocity V of arbitrary point P on substrate holder 13 can be represented by equations 1 and 3. From these equations, the absolute value of vector V=(Vx,Vy) is calculated as $((-\omega R)^2 \sin^2(\phi t) + (\omega R)^2 \cos^2(\phi t))^{1/2} = \omega R$, which is independent of the location of P and remains to be constant irrespective of the duration of time. The direction of vector V changes as substrate holder 13 rotates. As substrate holder 13 rotates once, the direction of vector V also rotates once. Consequently as a substrate holder 13 rotates by 360 degrees, arbitrary point P on wafer 14 to be polished will have a constant relative velocity V with a constant absolute value. By interpreting this theoretical result from the polishing viewpoint, the present invention recognizes that every point on wafer 14 will be equally and uniformly polished irrespective of the point of its location on the IC substrate when $\phi$ is approximately equal to $\omega$. It is noteworthy that this theoretical analysis is consistent with the above-mentioned experimental result.

Figure 6:
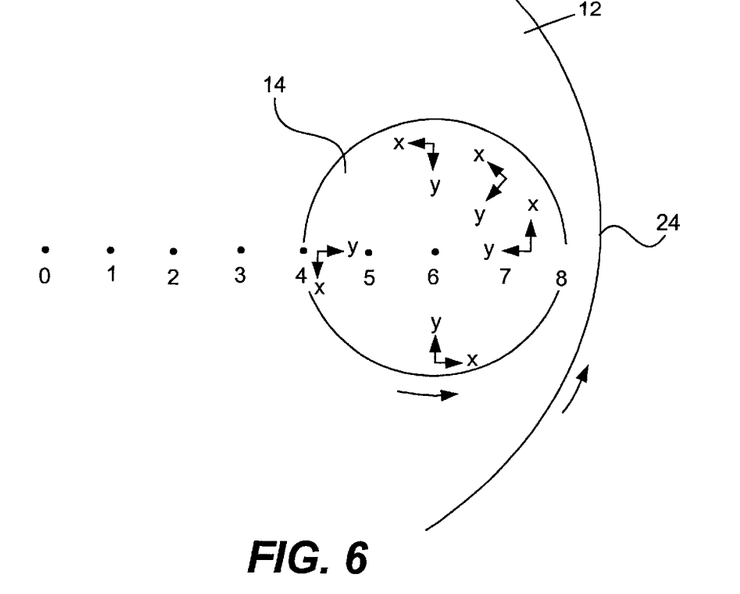
FIG. 6 shows a geometrical relationship between an IC substrate and the polishing table.

The present invention also offers a geometrical explanation using equations 1–3 to arrive at the same conclusion as the theoretical analysis and experimental results presented above. FIG. 6 shows IC substrate 14 situated on polishing table 12 having an edge represented by reference numeral 24. It is important to keep in mind that if the IC substrate is held by a substrate holder as shown in FIG. 1, then the rotational velocity of the IC substrate is substantially the same as the rotational velocity of the substrate holder.

Figure 7:
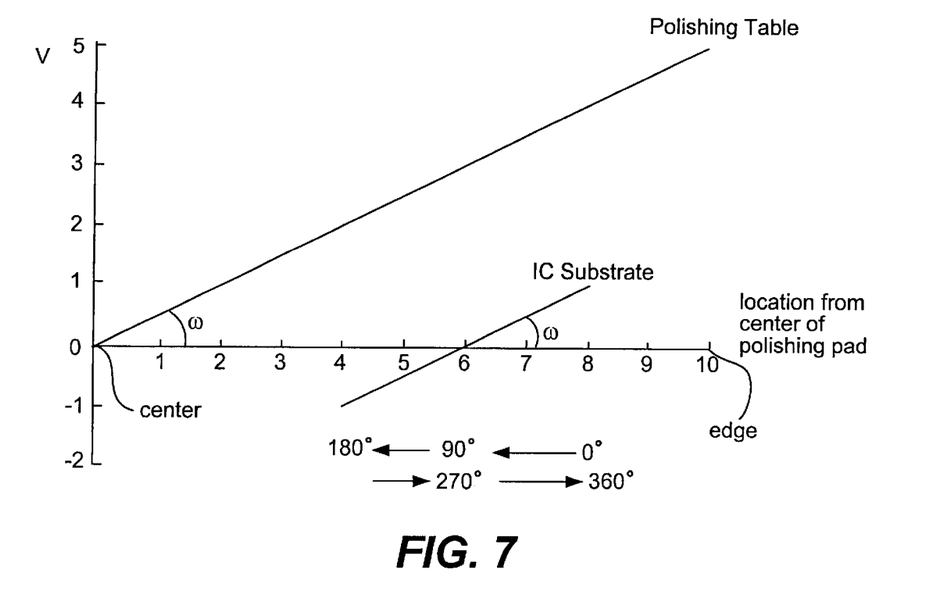
FIG. 7 shows a graph of rotational velocities versus the distance from the origin of polishing table to the edge for the IC substrate and polishing table of FIG. 6.

In FIG. 7, each of the rotational velocities of polishing table 12 and wafer 14 is illustrated, where x axis represent the distance from the center of polishing table to the edge (also see FIG. 6).

Figure 8:
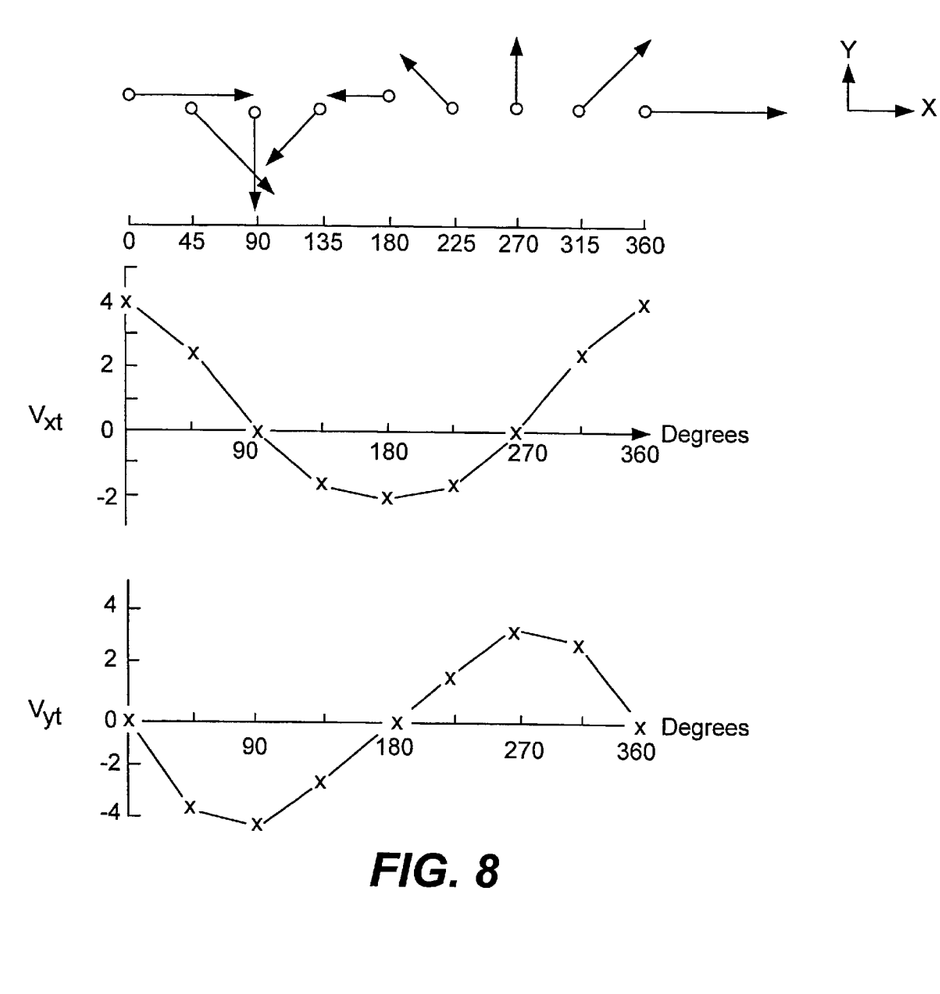
FIG. 8 shows three diagrams, the top one of which shows the time change in velocity vector V of a point on the polishing table and the diagrams below show the time changes in the x and y components of V, Vxt and Vyt, plotted against the angles around an origin or center of the polishing table.

FIG. 8 shows three diagrams. In the first (top) diagram, the time change in velocity vector V of a point on polishing table 12 is shown, where the x axis represents the angle around the center (or origin) of polishing table 12. In the second and third diagrams, the time changes in the x and y components of V, Vxt and Vyt, are plotted against the x axis (which are angles around the center of the polishing table or origin). The angle around the origin, which angle is measured from 0 degree to 360 degree, represents a progression in time. The suffix "t" associated with velocity, V, in FIG. 8 means that these values are associated with the polishing table.

Figure 9:
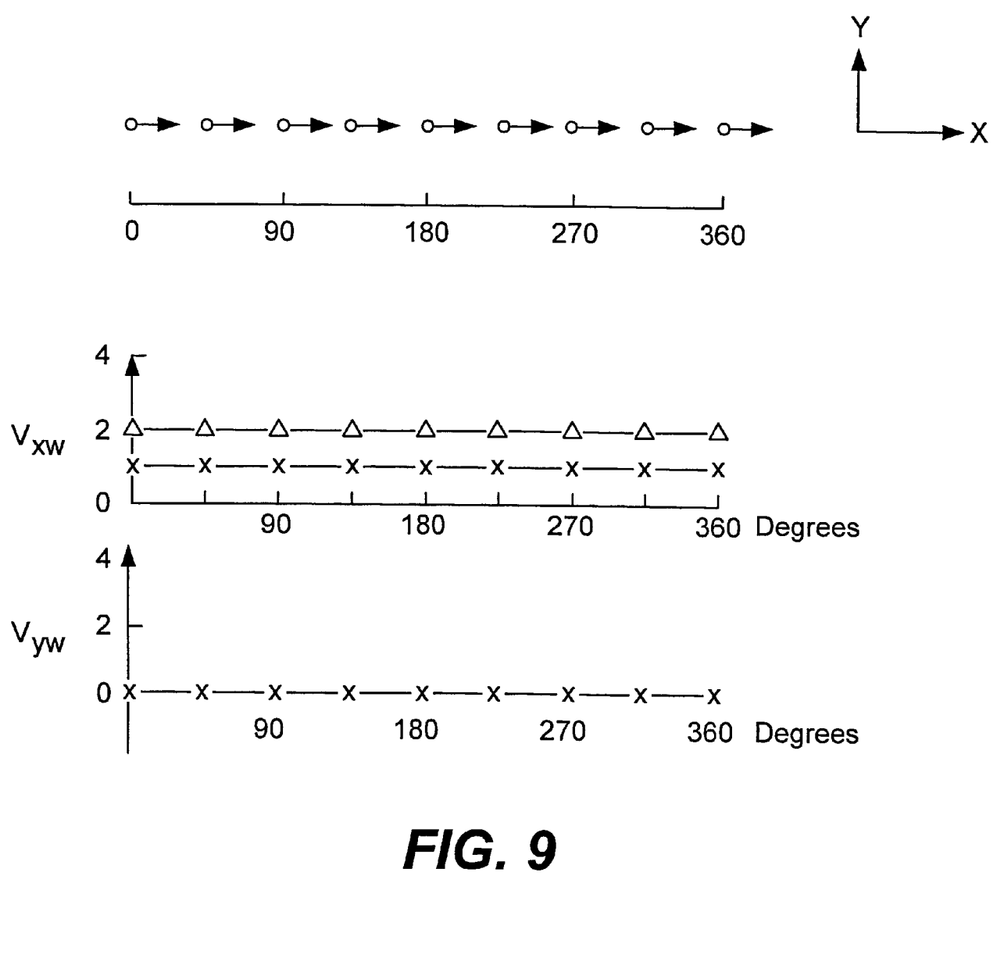
FIG. 9 shows three diagrams, the top one of which shows a time change in velocity vector V of a point on an IC substrate and the diagrams below show the time changes in the x and y components of V, Vxw and Vyw, plotted against the angle around the origin.

Similarly, FIG. 9 also shows three diagrams. In the first diagram of FIG. 9, the time change in velocity vector V of a point on IC substrate 14 is shown, where the x axis represents the angle around the origin. In the second and third diagrams, the time changes in the x and y components of V, Vxw an Vyw, are plotted against the x-axis as mentioned above. The suffix "w" associated with velocity, V, in FIG. 9, means that these values are associated with the wafer.

Figure 10:
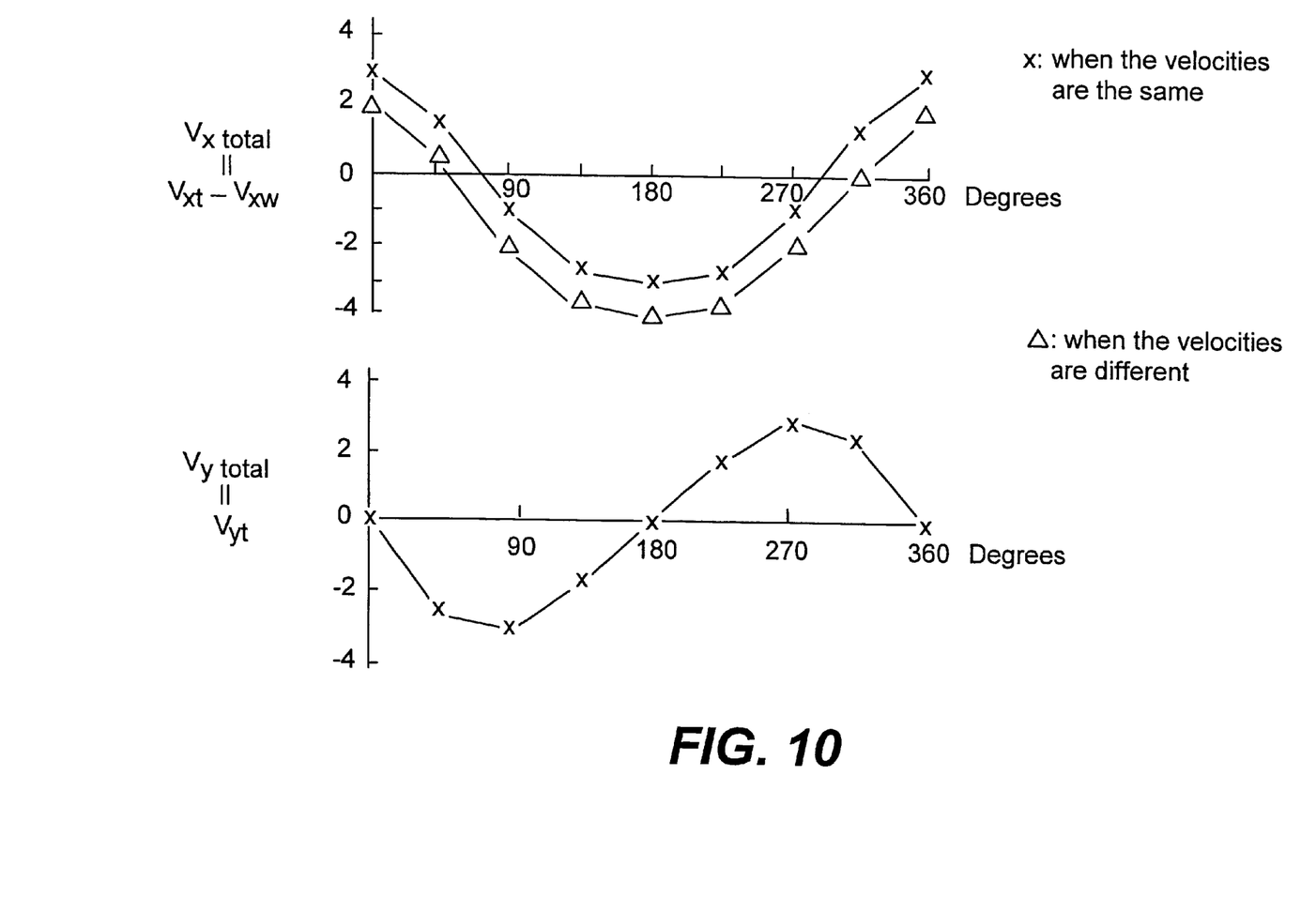
FIG. 10 is the result of combining each plot in FIGS. 8 and 9 and represents the relative velocity between the polishing table and the IC substrate.

FIG. 10 is the result of combining each plot in FIGS. 8 and 9 and represents the relative velocity between polishing table 12 and IC substrate 14 (or wafer). More particularly, the x component of the relative velocity V of a point on IC substrate 14, which is Vxtotal=Vxt-Vxw, is shown at the upper level of FIG. 10. In those cases where the rotational velocities of IC substrate 14 and polishing table 12 are the same, Vxtotal is indicated by a legend X and in those cases where the rotational velocities are different, Vxtotal is indicated by a legend A. In the lower level of FIG. 10, Vytotal=Vyt and Vytotal is plotted against the x axis (which represents the angle around the origin) for the case where the rotational velocities of wafer 14 and polishing table 12 are the same.

When the rotational velocities of wafer 14 and polishing table 12 are substantially the same, which situation is shown as the X plotted graph in the upper level of FIG. 10, the relative velocity of the point, as wafer 14 rotates by 360 degree, changes from positive to negative between 0 degree and 180 degree and returns from negative to positive while keeping the same shape. As is also intuitively understood from the geometry of these shapes, the integration of the function represented as the X plotted curve from 0 degree to 360 degree will be zero. In the case of the $\Delta$ plotted curve, which represents the case where the rotational velocities of wafer 14 and polishing table 12 are different, since the curve is slightly shifted downward, the integration will not be zero. At the lower level of FIG. 10, which only shows the case where the rotational velocities of wafer 14 and polishing table 12 are the same, similar geometrical interpretation is possible.

Those skilled in the art will recognize that the above geometrical phenomenon can be interpreted as the polishing condition of each point on IC substrate 14. When the rotational velocities of IC substrate 14 and polishing table 12 are the same, that is in the case of X plotted curve, the frictional forces between IC substrate 14 and polishing pad 11 at each point on IC substrate 14 will be balanced in all the directions as IC substrate 14 rotates itself by 360 degrees. In other words, the frictional force directed to each point on IC substrate 14 will be integrated to be zero by adding each infinitesimal amount at each moment together as vectors. Therefore, as far as the rotational velocities of IC substrate 14 and polishing table 12 are the same, all the points on the surface of IC substrate 14 will be polished irrespective of the location in such a manner that the equality and uniformity of the frictional forces in all directions will be maintained, thereby achieving the requisite amount of planarity. A substrate surface with the appropriate planarity facilitates in aligning and alignment tool or a stepper above the IC substrate surface so that the circuit pattern may be positioned at the desired location on the IC substrate surface during photolithography. The above geometrical consideration also coincides with the already mentioned experimental result.

As mentioned before, determining the end-point of the polishing process can be a challenging task when the rotational velocities of the polishing pad and the substrate are substantially the same or synchronized. Referring back to FIG. 1, current meter 17 is shown as being connected between power supply 16 and motor 15 and an endpoint detection system is associated with current meter 17. Motor 15 is controlled such that its rotational velocity remains substantially constant. Therefore, any change in the frictional force at the polishing interface between polishing pad 11 and IC substrate 14 can be detected through the changes in current detected by current meter 17. For example, the difference between the friction between the deposited tungsten and polishing pad 11 and the friction between the oxide beneath the tungsten layer and the polishing pad 11 can be detected through the changes in current detected by current meter 17.

Figure 11:
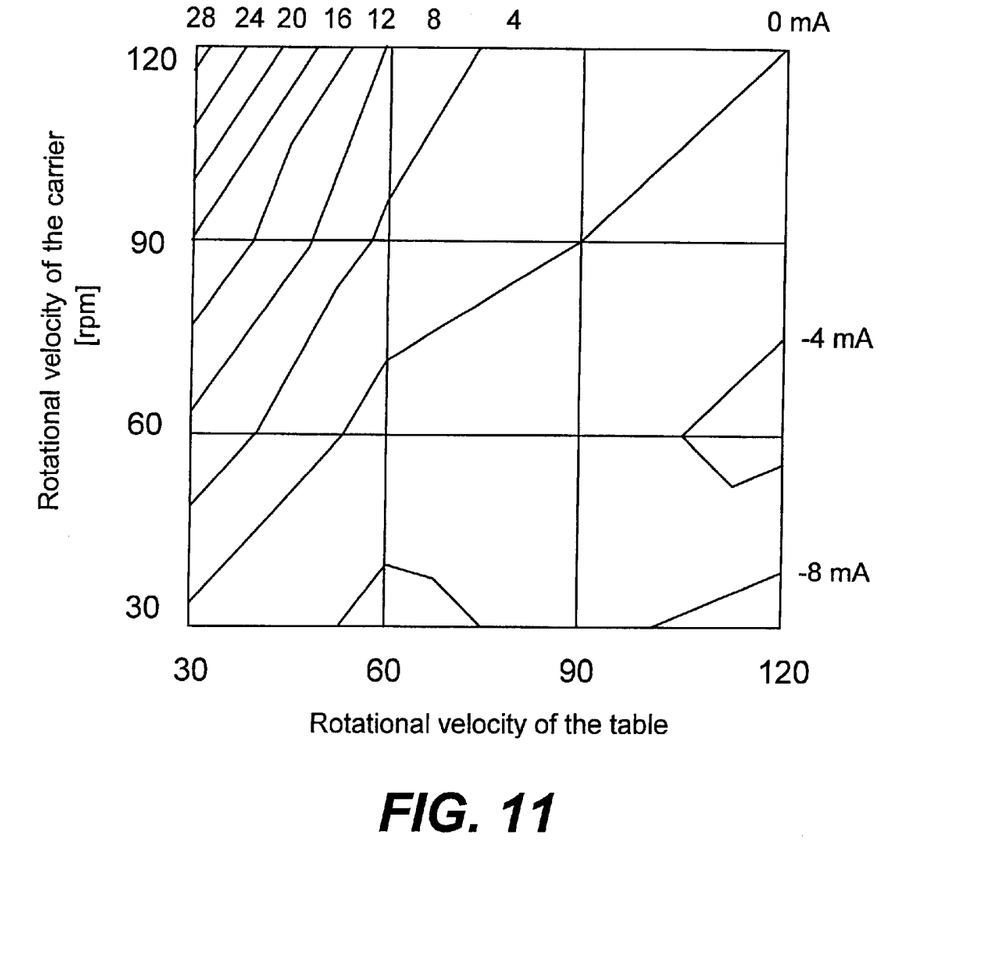
FIG. 11 shows changes in current flow detected by a current meter for combinations of rotational velocities of the substrate holder and the polishing table.

FIG. 11 shows a graph of various combinations of the rotational velocities of polishing table 12 and substrate holder 13 and the current required for the combination of these velocities. The change in the current detected by current motor 17 is at a minimum value when the velocities of polishing table 12 and substrate holder 14 are substantially the same, as shown by FIG. 11. Thus, the change in friction is minimized when the velocities of polishing table 12 and substrate holder 14 are the substantially the same and this means that the change in current used to detect the endpoint is going to be vague. In other words, from the standpoint of the endpoint detection, the synchronization of the rotational velocities of polishing table 12 and substrate holder 14 is undesirable because under such circumstances current detection is the hardest. The present invention recognizes that there is a trade off between the minimization of the alignment shift and the facilitation of the endpoint detection and that it is impossible to optimize both of them simultaneously without striking an appropriate balance between the conditions that minimize alignment shift and the conditions that optimize endpoint detection.

In accordance with one embodiment of the present invention, the entire polishing process is divided into two distinct stages. In the first stage of polishing, a predetermined difference between the rotational velocities of polishing table 12 and substrate holder 14 is maintained so that the endpoint can be readily detected by monitoring the current in the motor. After the endpoint is detected, the polishing process proceeds to the second stage and some additional polishing (over-polish) is performed during which the rotational velocities of polishing table 12 and wafer carrier 14 are synchronized in order to obtain a substantially planar substrate surface. Thus, the second stage is designed to minimize alignment shift and transfer the circuit or wiring pattern from a reticle to a substrate surface at the appropriate location. Thus, by dividing the entire polishing process into two distinct stages, each of which serves a distinct purpose but each of which cannot achieves both purposes simultaneously, the chemical mechanical polishing process of the present invention effectively determines the end-point of the polishing process and produces a substantially planar surface to facilitate the circuit pattern transferring process.

Although the present invention had been described with reference to preferred embodiments, the present invention is not intended to be limited the specific structure disclosed herein. Rather, it is readily appreciated by those skilled in the art will recognize that a variety of changes and modifications will be possible without departing the spirit and scope of the present invention. Thus the scope of the present invention is only defined by the claims and its equivalents.

What is claimed is:

1. A method for chemical-mechanical polishing of a layer that is deposited on a surface of an integrated circuit substrate, comprising:
   immobilizing said integrated circuit substrate using a substrate holder, said integrated circuit substrate surface being positioned against a surface of a polishing pad and said polishing pad being mounted on a supporting surface;
   a first stage of polishing said substrate surface including maintaining a difference between a rotational velocity of said polishing pad and a rotational velocity of said substrate holder allowing an endpoint of said chemical-mechanical polishing process of said layer to be detected; and
   a second stage of polishing the substrate such that said rotational velocity of said polishing pad and said rotational velocity of said substrate holder are substantially the same to produce a substantially planar substrate surface.

2. The method of claim 1, further comprising introducing slurry on the polishing pad.

3. The method of claim 1, wherein said layer is a conductive layer that is disposed above a dielectric layer.

4. The method of claim 3, wherein said conductive layer includes tungsten.

5. The method of claim 1, wherein said integrated circuit substrate is a semiconductor wafer.

6. The method of claim 5, wherein said substrate holder is a wafer carrier.

7. The method of claim 1, wherein said supporting surface is a polishing table or a platen.

8. The method of claim 1, wherein the rotational velocity of the polishing pad is controlled by adjusting a rotational velocity of said supporting surface.

9. The method of claim 1, wherein the rotational velocity of the integrated circuit substrate surface is controlled by adjusting a rotational velocity of said substrate holder.

10. The method of claim 1, wherein said second stage of polishing includes rotating both said polishing pad and said integrated circuit substrate surface in the same direction.

11. The method of claim 1, wherein said second stage of polishing is carried out until said integrated circuit substrate surface is substantially planar and said substantially planar integrated circuit substrate surface facilitates alignment of an alignment tool above said integrated circuit substrate.

12. The method of claim 1, wherein in said first stage of polishing, said endpoint of said chemical-mechanical polishing process of said layer is detected by monitoring changes in current flow in a motor that is rotating the substrate holder.

13. The method of claim 1, wherein said first stage of polishing includes rotating both said polishing pad and said integrated circuit substrate surface in the same direction.

14. A method for chemical-mechanical polishing a layer deposited on a surface of a semiconductor wafer, comprising:
   immobilizing the semiconductor wafer using a substrate holder pushing against a polishing pad that is mounted on a supporting surface;
   supplying a polishing agent at the interface between the polishing pad and the semiconductor wafer;
   a first stage of polishing said substrate surface including maintaining a difference between the rotational velocity of said polishing pad and the rotational velocity of said substrate holder allowing an endpoint of said chemical-mechanical polishing process of said layer to be detected; and
   a second stage of polishing the substrate such that said rotational velocity of said polishing pad and said rotational velocity of said substrate holder are substantially the same to produce a substantially planar substrate surface.

15. The method of claim 14, wherein said polishing agent is a slurry having chemical characteristics.

16. The method of claim 14, wherein said second stage of polishing produces a substantially planar semiconductor wafer surface.

17. The method of claim 14, wherein said second stage of polishing includes rotating said polishing pad and said semiconductor wafer in a same direction.

* * * * *